(12) United States Patent
Suzuki et al.

(10) Patent No.: US 8,168,555 B2
(45) Date of Patent: May 1, 2012

(54) CERAMIC SUBSTRATE, PROCESS FOR PRODUCING THE SAME, AND DIELECTRIC-PORCELAIN COMPOSITION

(75) Inventors: Toshiyuki Suzuki, Chuo-ku (JP); Yasuharu Miyauchi, Chuo-ku (JP); Isao Kanada, Chuo-ku (JP)

(73) Assignee: TDK Corporation, Chuo-ku, Tokyo (JP)

( * ) Notice: Subject to any disclaimer, the term of this patent is extended or adjusted under 35 U.S.C. 154(b) by 117 days.

(21) Appl. No.: 12/669,839

(22) PCT Filed: Jul. 18, 2008

(86) PCT No.: PCT/JP2008/063032
§ 371 (c)(1),
(2), (4) Date: Jan. 20, 2010

(87) PCT Pub. No.: WO2009/014092
PCT Pub. Date: Jan. 29, 2009

(65) Prior Publication Data
US 2010/0197478 A1   Aug. 5, 2010

(30) Foreign Application Priority Data

Jul. 23, 2007 (JP) ................ P2007-191319
Jul. 23, 2007 (JP) ................ P2007-191321
Nov. 30, 2007 (JP) ................ P2007-311007

(51) Int. Cl.
C04B 35/20 (2006.01)
C04B 35/117 (2006.01)

(52) U.S. Cl. ............................ 501/119; 501/122

(58) Field of Classification Search ........... 501/119, 501/122
See application file for complete search history.

(56) References Cited

U.S. PATENT DOCUMENTS

| 5,763,059 A | 6/1998 | Yamaguchi et al. |
| 6,579,818 B2 | 6/2003 | Kawai et al. |
| 7,232,781 B2* | 6/2007 | Ishitobi et al. ........... 501/136 |
| 7,276,460 B2 | 10/2007 | Kidani et al. |
| 7,517,823 B2 | 4/2009 | Arashi et al. |
| 7,655,588 B2 | 2/2010 | Arashi et al. |

FOREIGN PATENT DOCUMENTS

| JP | 61-242950 | 10/1986 |
| JP | 08-069715 | 3/1996 |
| JP | 9-142880 | 6/1997 |
| JP | 09-175855 | 7/1997 |
| JP | 2002-232095 | 8/2002 |
| JP | 2003-40668 | 2/2003 |
| JP | 2004-210568 | 7/2004 |
| JP | 2005-093546 | 4/2005 |
| JP | 2005-335986 | 12/2005 |
| JP | 2006-290728 | 10/2006 |
| JP | 2008105916 | * 5/2008 |

* cited by examiner

Primary Examiner — Karl Group

(74) Attorney, Agent, or Firm — Drinker Biddle & Reath LLP

(57) ABSTRACT

A ceramic substrate is provided as one having a large coefficient of thermal expansion α, having properties suitable for use as a high-frequency substrate, being capable of being fired at a low temperature, and having an excellent substrate strength. The ceramic substrate has a main composition containing $Mg_2SiO_4$ and a low-temperature-fired component, has the coefficient of thermal expansion a of not less than 9.0 ppm/° C., and contains up to 25 vol. % (excluding zero) $ZnAl_2O_4$ or up to 7 vol. % (excluding zero) $Al_2O_3$. A dielectric-porcelain composition is provided as one being capable of being fired at a temperature lower than a melting point of an Ag-based metal and being capable of demonstrating a sufficient bending strength even through firing at a low firing temperature. The dielectric-porcelain composition contains $Mg_2SiO_4$ as a major component and contains a zinc oxide, a boron oxide, an alkaline earth metal oxide, a copper compound, and a lithium compound as minor components.

2 Claims, 5 Drawing Sheets

CERAMIC SUBSTRATE, PROCESS FOR PRODUCING THE SAME, AND DIELECTRIC-PORCELAIN COMPOSITION

TECHNICAL FIELD

The present invention relates to a ceramic substrate having a coefficient of thermal expansion close to that of a printed circuit board and, more particularly, relates to an improvement in bending strength of a ceramic substrate containing $Mg_2SiO_4$ as a major component and also to a dielectric-porcelain composition.

BACKGROUND ART

For example, in the information and communication fields, frequency bands in use tend to transfer to high frequencies and high frequencies in the gigahertz (GHz) band are used in satellite broadcasting, satellite communications, and mobile communications such as cell phones and automobile phones.

In order to reduce a signal delay due to an interconnect capacitance, a substrate with low permittivity is needed for a circuit board with a wiring layer used in the high-frequency band as described above. Furthermore, the substrate needs to have a high Q value in order to avoid attenuation of the high-frequency signal. For producing such a substrate, a low-permittivity ceramic material (dielectric-porcelain composition) needs to be used, and there are desires for development of a ceramic material having the relative permittivity $\in r$ of approximately 6 to 11 and a large Q value.

$Mg_2SiO_4$ (forsterite) is one of materials having an extremely large Q value and a very low dielectric loss; $Mg_2SiO_4$ singly has Q·f of not less than 200000 GHz. $Mg_2SiO_4$ also has a relatively low relative permittivity $\in r$ and thus draws attention as one of the low-permittivity ceramic materials. There are proposals of various glass ceramics containing the forsterite phase (cf. Patent Documents 1-6 below).

For example, Patent Document 1 discloses a wiring board having an insulating substrate and a thin-film wiring conductor layer formed on a surface thereof, and describes that the insulating substrate contains at least Si, Al, Mg, Ba, a rare earth RE, and O as constituent elements and contains at least one selected from the forsterite crystal phase and the gahnite crystal phase, and celsian crystals as crystal phases.

Patent Document 2 discloses a low-temperature-fired ceramic sintered body containing as crystal phases, the gahnite crystal phase, the spinel crystal phase, the celsian crystal phase containing needle-like crystals having an aspect ratio of not less than 3, and at least one crystal phase selected from AlN, $Si_3N_4$, SiC, $Al_2O_3$, $ZrO_2$, $3Al_2O_3 \cdot 2SiO_2$, and $Mg_2SiO_4$.

The insulating substrate described in Patent Document 1 and the ceramic sintered body described in Patent Document 2 both have the structure in which each crystal phase is crystallized in glass through firing, and fall in the category of so-called glass ceramics.

Patent Document 3, which was filed by the applicant of the present application, discloses a dielectric-porcelain composition containing BaO, $Nd_2O_3$, $TiO_2$, MgO, and $SiO_2$ in a predetermined proportion, containing ZnO, $B_2O_3$, CuO, and an alkaline earth metal oxide RO in a predetermined proportion as minor components, and further containing Ag as a minor component. This dielectric-porcelain composition contains forsterite ($2MgO \cdot SiO_2$) crystals and can be fired at a low temperature.

Patent Document 4 discloses a composition for a ceramic substrate consisting of a glass powder, an alumina powder, and a forsterite powder, and Patent Document 5 discloses a low-temperature-fired porcelain composition which is made by forming a mixture powder obtained by mixing 55-99.5 wt % glass consisting of $SiO_2$, $Al_2O_3$, MgO, ZnO, and $B_2O_3$, and 0.1-45 wt % forsterite relative to the total amount, and thereafter firing the mixture powder at the temperature of 800-1000° C. in a nonoxidizing atmosphere, and which contains the gahnite crystal phase, cordierite crystal phase, forsterite crystal phase, enstatite crystal phase, and glass phase. The compositions disclosed in these patent documents can also be fired at the low temperature of not more than 1000° C.

On the other hand, Patent Document 6 discloses a dielectric-porcelain composition for high frequencies having a composition represented by general formula $xMgO$-$ySiO_2$-$zAl_2O_3$ (where x, y, and z represent weight percentages of the respective components, $60 \leq x \leq 90$, $10 \leq y \leq 40$, $0 \leq z \leq 10$, and $x+y+z=100$) as a major component and also containing an additive of up to 1 wt % ZnO as a minor component to the major component. An object of the invention described in Patent Document 6 is to provide the dielectric-porcelain composition having a high Q value and a low relative permittivity and fired at the firing temperature of 1550° C.-1600° C.

In recent years, the mobile communication equipment such as cell phones under increasing demands uses the high-frequency band called sub-microwaves of several hundred MHz to several GHz. For this reason, electronic components such as filters, resonators, capacitors, and circuit boards used in the mobile communication equipment are also required to have various properties suitable for use in the high-frequency band.

A circuit board, which is one of the electronic components used in the high-frequency band, needs to have a low relative permittivity, in order to reduce the signal delay due to an interconnect capacitance in its wiring layer. For avoiding attenuation of the high-frequency signal, the circuit board needs to have a large Q·f value (or a small dielectric loss). Therefore, a dielectric-porcelain composition having a low relative permittivity and a large Q·f value is demanded as a material for the circuit board. Q is a reciprocal of a tangent of a loss angle $\delta$ (or reciprocal of tan $\delta$), the loss angle $\delta$ being a difference between an actual phase difference between current and voltage in a dielectric and the ideal phase difference of 90° between current and voltage, and f is a resonant frequency.

For example, as described in Patent Documents 7 and 8 below, the dielectric-porcelain composition containing $Mg_2SiO_4$ (forsterite) as a major component (which will be referred to hereinafter as "forsterite-based composition") has a relatively low relative permittivity ar, the value of which is approximately 9 or less, and an extremely large Q·f value, the value of which is approximately $1 \times 10^5$ Hz or higher, and is thus suitable for use as a material for the circuit board.

Patent Document 1: Japanese Patent Application Laid-open No. 2005-93546
Patent Document 2: Japanese Patent Application Laid-open No. 2003-40668
Patent Document 3: Japanese Patent Application Laid-open No. 2006-290728
Patent Document 4: Japanese Patent Application Laid-open No. 561-242950
Patent Document 5: Japanese Patent Application Laid-open No. H9-175855
Patent Document 6: Japanese Patent Application Laid-open No. H8-69715
Patent Document 7: Japanese Patent Application Laid-open No. 2004-210568
Patent Document 8: Japanese Patent Application Laid-open No. 2005-335986

DISCLOSURE OF THE INVENTION

Problem to be Solved by the Invention

Incidentally, an LTCC substrate, which can be fired at a low temperature, is commonly used as an inexpensive high-frequency substrate, and with downsizing and higher integration of components, there are, for example, needs for devices and others wherein a bare chip, a surface mount device (SMD), or the like is mounted on the LTCC substrate and needs for direct mounting of the LTCC substrate on a printed circuit board (PCB).

In this case, the substrate itself is required to have higher strength, e.g., with a tendency toward a lower profile of devices and, in order to relax stress on the substrate due to a thermal contraction difference from the printed circuit board consisting of a glass epoxy substrate or the like, there are needs for a substrate material having a coefficient of thermal expansion close to that of the printed circuit board. In the case of the inventions described in respective Patent Documents 1-6 above, however, no consideration is given to the coefficient of thermal expansion of the substrate and it is the case that there is little study on how to design the LTCC substrate in order to realize the coefficient of thermal expansion close to that of the printed circuit board.

The present invention has been accomplished under the conventional circumstance as discussed above, and it is a first object of the present invention to provide a ceramic substrate having a coefficient of thermal expansion close to that of the printed circuit board such as a glass epoxy substrate, having properties suitable for use as a high-frequency substrate, being capable of being fired at a low temperature, and having an excellent substrate strength, and to provide a process for producing the ceramic substrate.

In forming a circuit board using the aforementioned forsterite-based composition, the forsterite-based composition needs to be simultaneously fired with a conductor material for electrodes and wires of the circuit board. The sintering temperature of the forsterite-based composition is about 1000° C. or lower, which is lower than those of the conventional dielectric-porcelain compositions, and therefore the metal Ag or an Ag-based alloy (which will be referred to hereinafter as the Ag-based metal), which has a lower melting point and lower resistance and is less expensive than Pd and Pt used as conventional conductor materials, can be used as a conductor material. Namely, the forsterite can be simultaneously fired with the Ag-based metal, at a temperature low enough to suppress melting of the Ag-based metal being the conductor material.

There was, however, a significant problem in practical use that the forsterite alone after fired had the low bending strength of not more than 40 MPa and the bending strength of the forsterite-based composition after fired also tended to be lower than those of the other dielectric-porcelain compositions. In general, the bending strength of the dielectric-porcelain composition after fired tends to decrease with decrease in the firing temperature, and in the case of the forsterite-based composition, there was a problem that the bending strength was likely to decrease after firing at the low temperature (e.g., a temperature lower than the melting point of the Ag-based metal).

The present invention has been accomplished in view of the above problem and it is a second object of the present invention to provide a dielectric-porcelain composition being capable of being fired at a low temperature (temperature lower than the melting point of the Ag-based metal) and being capable of demonstrating a sufficient bending strength even through firing at the low firing temperature.

Means for Solving the Problem

The inventors conducted research over long periods of time, in order to achieve the first object described above. As a consequence of the research, we came to have the following finding. First, we found that a ceramic substrate having a large coefficient of thermal expansion and being capable of being fired at a low temperature could be realized by using $Mg_2SiO_4$ as a dielectric material, properly selecting a low-temperature-fired component (component fired at a low temperature), and adjusting a composition of these. In this case, however, there arises a problem of insufficient strength. We then conducted further research and found that addition of $ZnAl_2O_4$ or addition of a small amount of $Al_2O_3$ powder was uniquely effective to improvement in strength.

The present invention has been accomplished based on these findings. Namely, a ceramic substrate according to a first aspect of the present invention is a ceramic substrate having a main composition comprising $Mg_2SiO_4$ and a low-temperature-fired component and having a coefficient of thermal expansion a of not less than 9.0 ppm/° C., which comprises up to 25 vol. % (excluding zero) $ZnAl_2O_4$.

The ceramic substrate according to the first aspect of the present invention has the main composition comprising $Mg_2SiO_4$ and the low-temperature-fired component and can be fired, for example, at a low temperature of not more than 1000° C. Furthermore, the ceramic substrate has the coefficient of thermal expansion a of not less than 9.0 ppm/° C., which is larger than those of ordinary ceramic substrates and which is close to that of the printed circuit board such as a glass epoxy substrate, and therefore, even in the case where it is directly mounted on the printed circuit board (PCB), great reduction is achieved in occurrence of stress due to the difference between coefficients of thermal expansion.

Furthermore, the ceramic substrate according to the first aspect of the present invention also realizes improvement in substrate strength, simultaneously with the increase in the value of the coefficient of thermal expansion α. For increasing the value of the coefficient of thermal expansion α of the ceramic substrate, it is necessary, for example, to increase the proportion of $Mg_2SiO_4$. However, the increase in the proportion of $Mg_2SiO_4$ leads to abrupt decrease in substrate strength. In the ceramic substrate of the present invention, therefore, $ZnAl_2O_4$ is added in the proportion of not more than 25 vol. % (excluding zero). The addition of $ZnAl_2O_4$ is effective to the improvement in substrate strength, thereby realizing the low-temperature-fired ceramic substrate with excellent substrate strength.

In the case of the ceramic substrate comprising the $Mg_2SiO_4$ and low-temperature-fired component, when an Ag conductor is formed on a surface of the substrate, there appears a phenomenon that a region around the conductor is discolored into brown with melting of Ag. Occurrence of the discoloration results in significant degradation of quality of the ceramic substrate, but the addition of $ZnAl_2O_4$ is also effective to prevention of the discoloration. The addition of $ZnAl_2O_4$ can suppress the discoloration of the region around the conductor.

A ceramic substrate according to a second aspect of the present invention is a ceramic substrate having a main composition comprising $Mg_2SiO_4$ and a low-temperature-fired component and having a coefficient of thermal expansion a of not less than 9.0 ppm/° C., which comprises up to 7 vol. % (excluding zero) $Al_2O_3$.

A process for producing the ceramic substrate according to the second aspect of the present invention comprises adding $Al_2O_3$ having an average particle size of not more than 1.0 μm in a proportion of not more than 7 vol. % (excluding zero) to a main composition comprising $Mg_2SiO_4$ and a low-temperature-fired component, and firing a resultant mixture at a temperature not more than a melting point of an electrode.

The ceramic substrate according to the second aspect of the present invention has the main composition comprising $Mg_2SiO_4$ and the low-temperature-fired component and can be fired, for example, at a low temperature of not more than 1000° C. It also has the coefficient of thermal expansion a of not less than 9.0 ppm/° C., which is larger than those of ordinary ceramic substrates and which is close to that of the printed circuit board such as a glass epoxy substrate, and therefore, even in the case where it is directly mounted on the printed circuit board (PCB), great reduction is achieved in occurrence of stress due to the difference between coefficients of thermal expansion.

Furthermore, the ceramic substrate according to the second aspect of the present invention also realizes improvement in substrate strength, simultaneously with the increase in the value of the coefficient of thermal expansion α. For increasing the value of the coefficient of thermal expansion α of the ceramic substrate, it is necessary, for example, to increase the proportion of $Mg_2SiO_4$. However, the increase in the proportion of $Mg_2SiO_4$ leads to abrupt decrease in substrate strength. In the ceramic substrate of the present invention, therefore, $Al_2O_3$ is added in the proportion of not more than 7 vol. % (excluding zero). The addition of $Al_2O_3$ is effective to the improvement in substrate strength, thereby realizing the low-temperature-fired ceramic substrate with excellent substrate strength.

In order to achieve the aforementioned second object, a dielectric-porcelain composition according to the present invention comprises $Mg_2SiO_4$ as a major component and comprises a zinc oxide, a boron oxide, an alkaline earth metal oxide, a copper compound, and a lithium compound as minor components.

As the dielectric-porcelain composition has the foregoing constitution, the dielectric-porcelain composition can be fired at a low temperature (temperature lower than the melting point of the Ag-based metal) and it is feasible to suppress reduction in bending strength due to decrease in the firing temperature of the dielectric-porcelain composition. Namely, the foregoing constitution permits the bending strength of the dielectric-porcelain composition (dielectric porcelain) after fired at the low temperature to be higher than those of the conventional forsterite-based compositions.

The dielectric-porcelain composition is a raw composition for a dielectric porcelain, and the dielectric porcelain as a sintered body can be obtained by sintering of the dielectric-porcelain composition. The sintering is a phenomenon in which as the dielectric-porcelain composition is heated, the dielectric-porcelain composition turns into a dense object called a sintered body. In general, the sintered body has the density, mechanical strength, etc. greater than those of the dielectric-porcelain composition before heated. The sintering temperature is a temperature of the dielectric-porcelain composition upon the sintering thereof. The firing means a heating treatment for the purpose of sintering and the firing temperature is a temperature of an atmosphere to which the dielectric-porcelain composition is exposed during the heating treatment.

In the dielectric-porcelain composition of the present invention, when the mass of the lithium compound is converted to $Li_2O$, a content c of the lithium compound is preferably in the range of 0.38 mass % $\leq$ c $\leq$ 1.2 mass %, relative to the whole of the dielectric-porcelain composition.

This permits the dielectric-porcelain composition to be fired at a lower temperature and makes it feasible to more certainly suppress the reduction in bending strength due to the decrease in the firing temperature of the dielectric-porcelain composition.

Effect of the Invention

According to the first and second aspects of the present invention, the ceramic substrate can be provided as one having the coefficient of thermal expansion close to that of the printed circuit board such as a glass epoxy substrate, having properties suitable for use as a high-frequency substrate, being capable of being fired at the low temperature, and having the excellent substrate strength. According to the first aspect of the present invention, the high-quality ceramic substrate can be provided as one prevented from being discolored in the region around the conductor even in the case where the conductor of Ag or the like is formed on the surface of the substrate. According to the present invention, the dielectric-porcelain composition can be provided as one being capable of being fired at the low temperature (temperature lower than the melting point of the Ag-based metal) and being capable of demonstrating the sufficient bending strength even through firing at the low temperature.

BEST MODE FOR CARRYING OUT THE INVENTION

Figure 1:
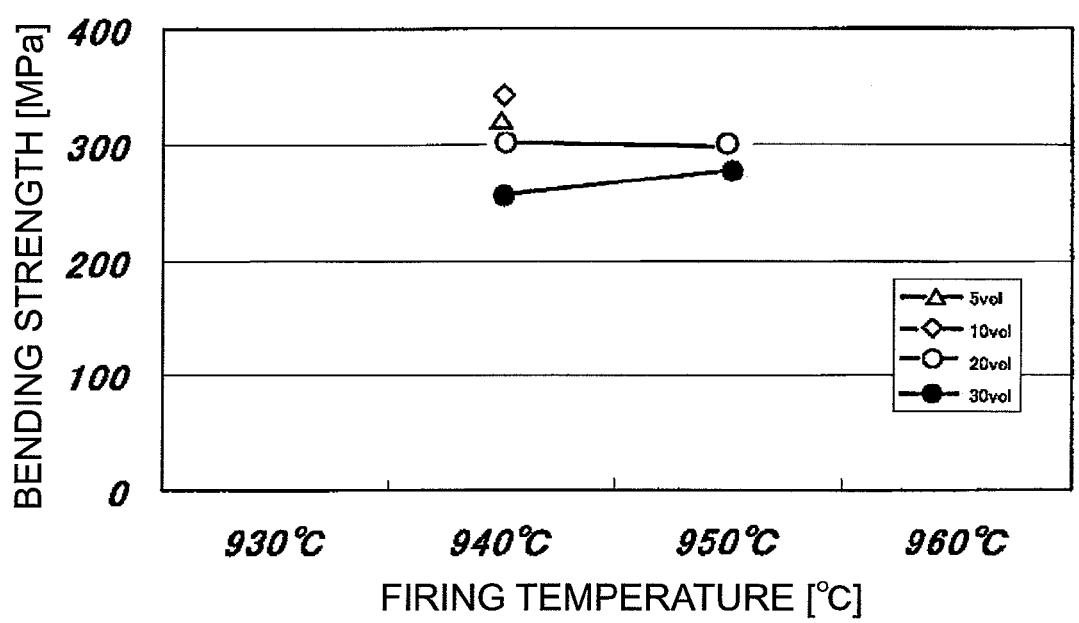
FIG. 1 is a characteristic diagram showing a relation of firing temperature vs. bending strength at each of additive amounts in the additive amount range of $ZnAl_2O_4$ from 5 vol. % to 30 vol. %.

[First Embodiment]
(Ceramic Substrate)
The first embodiment of the ceramic substrate to which the first or second aspect of the present invention is applied will be described below in detail. It should be noted, however, that the present invention is by no means intended to be limited to the following embodiment.

The ceramic substrate according to the first or second aspect of the present invention is a low-temperature-fired ceramic substrate made of a dielectric material having a main composition containing $Mg_2SiO_4$ (forsterite) and a low-temperature-fired component. $Mg_2SiO_4$ singly has Q·f of not less than 200000 GHz and a low-dielectric-loss material can be realized when containing it as a major component. It is therefore contemplated that the major component is 100% $Mg_2SiO_4$, but it is also possible to add any one of well-known additives according to need, for example, in order to adjust the permittivity. Examples of the additives include magnesium titanate ($MgTiO_3$) having the relative permittivity ∈r of about 17 and calcium titanate ($CaTiO_3$) having the relative permittivity ∈r of about 200. In this case, they both have the Q value smaller than that of forsterite and substrates obtained by the addition thereof tend to have lower Q values; it is thus necessary to give adequate consideration to an additive amount thereof.

In $Mg_2SiO_4$ (forsterite), a stoichiometric composition ratio of $MgO:SiO_2$ is 2:1, but the composition ratio does not always have to be limited to this and may deviate from the foregoing composition ratio. However, the prescribed properties cannot be achieved if the composition ratio deviates significantly from the stoichiometric composition ratio; therefore, the ratio of $MgO:SiO_2$ is preferably determined in the range of 1.9:1.1 to 2.1:0.9.

The aforementioned $Mg_2SiO_4$ (forsterite) is also suitable as a constituent component of the main composition in terms of the coefficient of thermal expansion α. Since $Mg_2SiO_4$ (forsterite) has the large coefficient of thermal expansion α, a ceramic substrate with a large coefficient of thermal expansion α can be realized by increasing the ratio of $Mg_2SiO_4$ (forsterite) in the main composition. However, for example, 100% $Mg_2SiO_4$ makes firing at low temperature difficult and fails to ensure a satisfactory substrate strength.

In the ceramic substrate according to the first or second aspect of the present invention, therefore, the ratio of $Mg_2SiO_4$ (forsterite) is optimized and the low-temperature-fired component is used in combination, whereby the ceramic substrate is realized as one having the relative permittivity ∈r of not more than 8, Q of not less than 2000, and the coefficient of thermal expansion α of not less than 9.0 ppm/° C. and being capable of being fired at the temperature of not more than 1000° C. The composition of $Mg_2SiO_4$ (forsterite) and the type and composition of the low-temperature-fired component may be set within ranges satisfying the aforementioned properties. Particularly, concerning the coefficient of thermal expansion α of the ceramic substrate, it is preferably set in the range of α≧9.0 ppm/° C. so that it can be close to the coefficient of thermal expansion of the glass epoxy substrate (e.g., approximately 9-14 ppm/° C.); for example, even in the case where the ceramic substrate according to the first or second aspect of the present invention is directly mounted on a printed circuit board, it is feasible to suppress occurrence of stress due to the difference between the coefficients of thermal expansion.

The low-temperature-fired component can be any component that can be sintered at a temperature lower than $Mg_2SiO_4$ (forsterite) can, and may be selected from various oxides. The ratio of the low-temperature-fired component is also optional but the ratio of the low-temperature-fired component needs to be set taking the following point into consideration: the ceramic substrate according to the first or second aspect of the present invention is not a glass ceramic wherein a ceramic component is dispersed in a glass component, but is a low-temperature-fired ceramic wherein $Mg_2SiO_4$ (forsterite) is sintered.

Furthermore, $Mg_2SiO_4$ of the major component is the low-dielectric-loss material as described above, which has the low relative permittivity ∈r of about 6 to 7, and is thus a material satisfying the demand for low permittivity. However, $Mg_2SiO_4$ singly has the low bending strength, which is a significant problem in practical use. It is therefore preferable to achieve an improvement in bending strength by selecting and adding an appropriate oxide as the low-temperature-fired component.

According to the inventors' repeated studies, it is effective to add ZnO, $B_2O_3$, CuO, and RO (where R denotes an alkaline earth metal) as the low-temperature-fired component. In the ceramic substrate according to the first or second aspect of the present invention, therefore, it is preferable to add these four components to the aforementioned major component ($Mg_2SiO_4$) to obtain the main composition. There is an optimum range for each of additive amounts of the respective components in the main composition and each component is preferably added within a predetermined range.

First, as to ZnO, the additive amount thereof is preferably determined in the range of 8 mass % to 20 mass %. Specifically, a ratio of the mass b of ZnO to the total mass (a+b+c+d+e), b/(a+b+c+d+e), is preferably in the range of 8% to 20%, where a is the mass of $Mg_2SiO_4$, b the mass of ZnO, c the mass of $B_2O_3$, d the mass of CuO, and e the mass of RO. If the additive amount of ZnO [the ratio b/(a+b+c+d+e) of the mass b of ZnO] is less than 8 mass %, the expected effect cannot be achieved and the bending strength may be insufficient. If the additive amount of ZnO [the ratio b/(a+b+c+d+e) of the mass b of ZnO to the total mass] exceeds 20 mass % on the contrary, Q will become lowered and it may be difficult to achieve Q·f of not less than 2000 GHz.

The additive amount of $B_2O_3$ is preferably determined in the range of 3 mass % to 10 mass %. Specifically, where c is the mass of $B_2O_3$, a ratio of the mass c of $B_2O_3$ to the total mass (a+b+c+d+e), c/(a+b+c+d+e), is preferably in the range of 3% to 10%. If the additive amount of $B_2O_3$ [the ratio c/(a+b+c+d+e) of the mass c of $B_2O_3$ to the total mass] is less than 3 mass %, Q will become lowered and it may be difficult to achieve Q·f of not less than 2000 GHz. If the additive amount of $B_2O_3$ [the ratio c/(a+b+c+d+e) of the mass c of $B_2O_3$ to the total mass] exceeds 10 mass %, the substrate density will be too low to achieve sufficient strength.

The additive amount of CuO is preferably determined in the range of 2 mass % to 8 mass %. Specifically, where the mass of CuO is d, a ratio of the mass d of CuO to the total mass (a+b+c+d+e), d/(a+b+c+d+e), is preferably in the range of 2% to 8%. If the additive amount of CuO [the ratio d/(a+b+c+d+e) of the mass d of CuO to the total mass] is less than 2 mass %, the substrate density will be insufficient and it will be necessary to set the substrate firing temperature to a higher temperature. In this case, it becomes difficult to perform simultaneous firing with electrodes and this limits the usage of the substrate. If the additive amount of CuO [the ratio d/(a+b+c+d+e) of the mass d of CuO to the total mass] exceeds 8 mass % on the contrary, Q will become lowered and it may be difficult to achieve Q·f of not less than 2000 GHz.

The additive amount of RO (where R denotes an alkaline earth metal) is preferably determined in the range of 1 mass % to 4 mass %. Specifically, where the mass of RO is e, a ratio of the mass e of RO to the total mass (a+b+c+d+e), e/(a+b+c+d+e), is preferably in the range of 1% to 4%. If the additive amount of RO [the ratio e/(a+b+c+d+e) of the mass e of RO to the total mass] is less than 1 mass %, the substrate density will be insufficient and it will be necessary to set the substrate firing temperature to a higher temperature. In this case, it is difficult to perform simultaneous firing with electrodes and this limits the usage of the substrate. If the additive amount of RO [the ratio e/(a+b+c+d+e) of the mass e of RO to the total mass] exceeds 4 mass % on the contrary, Q will become lowered and it may be difficult to achieve Q·f of not less than 2000 GHz.

In the RO, R (alkaline earth metal) can be Ca, Sr, or Ba. The RO to be added may be one, or two or more out of oxides of these alkaline earth metals.

As described above, when the four components (ZnO, $B_2O_3$, CuO, and RO) are added as the low-temperature-fired component in the dielectric-porcelain composition containing the major component of $Mg_2SiO_4$ (forsterite), the bending strength can be largely improved and it is feasible to take advantage of the dielectric property of $Mg_2SiO_4$ (forsterite). For example, the dielectric-porcelain composition can be provided as one having the bending strength of not less than 100 MPa, the relative permittivity $\in r$ of 7±1, and Q·f of not less than 2000 GHz, by setting the ratio b/(a+b+c+d+e) of the mass b of ZnO to the total mass (a+b+c+d+e) in the range of 8% to 20%, the ratio c/(a+b+c+d+e) of the mass c of $B_2O_3$ in the range of 3% to 10%, the ratio d/(a+b+c+d+e) of the mass d of CuO in the range of 2% to 8%, and the ratio e/(a+b+c+d+e) of the mass e of RO in the range of 1% to 4%, where a is the mass of $Mg_2SiO_4$, b the mass of ZnO, c the mass of $B_2O_3$, d the mass of CuO, and e the mass of RO.

The bending strength of not less than 200 MPa can be realized by setting the ratio b/(a+b+c+d+e) of the mass b of ZnO to the total mass (a+b+c+d+e) in the range of 12% to 20%, the ratio c/(a+b+c+d+e) of the mass c of $B_2O_3$ in the range of 3% to 9%, the ratio d/(a+b+c+d+e) of the mass d of CuO in the range of 4% to 8%, and the ratio e/(a+b+c+d+e) of the mass e of RO in the range of 2% to 4%.

The above described the configuration of the main composition used in the ceramic substrate according to the first or second aspect of the present invention, and a significant feature of the ceramic substrate according to the first aspect of the present invention is that the ceramic substrate further contains $ZnAl_2O_4$ in a proportion of not more than 25 vol. % (excluding zero).

As described above, the use of $Mg_2SiO_4$ (forsterite) leads to insufficient substrate strength. This insufficient substrate strength can be improved to some extent by selecting the low-temperature-fired component and can be more improved by adding $ZnAl_2O_4$. The addition of $ZnAl_2O_4$ is also effective to prevent discoloration of the region around the Ag conductor. The addition of $ZnAl_2O_4$ prevents the region around the conductor from becoming discolored into brown even through simultaneous firing with the Ag conductor.

An additive amount of $ZnAl_2O_4$ is preferably determined in the range of not more than 25 vol. % (excluding zero) to the main composition. If the additive amount of $ZnAl_2O_4$ exceeds 25 vol. %, the bending strength may become lowered on the contrary. On the other hand, if the additive amount of $ZnAl_2O_4$ is zero, the strength improving effect cannot be achieved, so as to result in insufficient bending strength of the substrate. A more preferred range of the content (additive amount) of $ZnAl_2O_4$ is from 5 vol. % to 20 vol. %.

In the case of the ceramic substrate according to the second aspect of the present invention, a significant feature thereof is that the ceramic substrate further contains $Al_2O_3$ in a proportion of not more than 7 vol. % (excluding zero) in addition to the aforementioned main composition.

As described above, the use of $Mg_2SiO_4$ (forsterite) leads to insufficient substrate strength. This insufficient substrate strength can be improved to some extent by selecting the low-temperature-fired component, and can be more improved by adding $Al_2O_3$.

An additive amount of $Al_2O_3$ is preferably determined in the range of not more than 7 vol. % (excluding zero) to the main composition. If the additive amount of $Al_2O_3$ exceeds 7 vol. %, the coefficient of thermal expansion a of the ceramic substrate will become lowered and may become lower than the required value. The bending strength will also become lowered on the contrary if the additive amount of $Al_2O_3$ exceeds 7 vol. %. On the other hand, if the additive amount of $Al_2O_3$ is zero, the strength improving effect cannot be achieved, so as to result in insufficient bending strength of the substrate. A more preferred range of the content (additive amount) of $Al_2O_3$ is from 1 vol. % to 7 vol. %.

For producing the ceramic substrate according to the second aspect of the present invention, a powder of mentioned $Al_2O_3$ is added to the main composition and the mixture is fired; an average particle size of the $Al_2O_3$ powder to be added is preferably as small as possible. The improving effect of bending strength can be significant by using the $Al_2O_3$ powder with the small average particle size. Specifically, the average particle size of the $Al_2O_3$ powder to be used is preferably not more than 1.0 μm.

(Process for Producing Ceramic Substrate)

For producing the ceramic substrate according to the first aspect of the present invention, aforementioned $ZnAl_2O_4$ is added to the main composition and the mixture is fired. For producing the ceramic substrate according to the second aspect of the present invention, aforementioned $Al_2O_3$ is added to the main composition and the mixture is fired. A process for producing the ceramic substrate according to the first or second aspect of the present invention will be described below. For producing the ceramic substrate according to the first or second aspect of the present invention, $Mg_2SiO_4$ (forsterite) as the major component of the main composition is first produced. Specifically, a mixing step is carried out to mix MgO and $SiO_2$ as raw materials of $Mg_2SiO_4$ (forsterite). These raw materials may be mixed by dry mixing or by wet mixing. In the case of wet mixing, for example, pure water or ethanol is used as a mixing solvent and the mixing is carried out using a ball mill or the like. A mixing duration is, for example, approximately from four hours to twenty four hours.

When the mixing is carried out by wet mixing, a drying step is carried out to adequately dry the mixture. The drying step is to carry out the drying, for example, at the temperature in the range of 100° C. to 200° C., preferably in the range of 120° C. to 140° C., for about twelve to thirty six hours.

The mixed and dried raw-material mixture is pre-fired in the next pre-firing step. The pre-firing is a step of bringing about reaction between MgO and $SiO_2$ as raw materials to synthesize crystals of $Mg_2SiO_4$ (forsterite), and the pre-firing can produce a pre-fired product most of which is $Mg_2SiO_4$ (forsterite). The pre-firing is carried out at the temperature in the range of 1000° C. to 1500° C., preferably in the range of 1100° C. to 1350° C. A processing duration is preferably approximately from one hour to twenty four hours.

After the pre-firing, a pulverizing step is carried out to pulverize the pre-fired product and a drying step is further carried out to dry it. The pulverizing step is to pulverize the pre-fired product by dry pulverization or by wet pulverization to obtain a powder. When the pulverizing step is carried out by wet pulverization, for example, pure water or ethanol is used as a mixing solvent and the pulverization is carried out using a ball mill or the like. A mixing duration is, for example, approximately from four hours to twenty four hours. The drying step is to perform drying, for example, at the temperature in the range of 100° C. to 200° C., preferably in the range of 120° C. to 140° C., for about twelve hours to thirty six hours. This leads to production of a raw powder of $Mg_2SiO_4$ (forsterite) being the major component.

The raw powder of $Mg_2SiO_4$ (forsterite) can also be a commercially available forsterite. In that case, however, it is unpreferable to use the commercially available forsterite as it is, and, instead thereof, it is preferable, for example, to use a product resulting from a process of wet pulverizing the commercially available forsterite with the use of a ball mill or the like and then drying the pulverized product, for example, at the temperature in the range of 100° C. to 200° C., preferably in the range of 120° C. to 140° C., for about twelve hours to thirty six hours.

Then predetermined amounts of the raw materials (ZnO, $B_2O_3$, CuO, and RO) of the low-temperature-fired component are added to the raw powder of $Mg_2SiO_4$ (forsterite), and they are mixed in a mixing step and dried in a drying step. The mixing step may be carried out by dry mixing or by wet mixing as the foregoing mixing step. In the case of wet mixing, for example, pure water or ethanol may be used as a mixing solvent and the mixing may be carried out using a ball mill or the like. A mixing duration may be, for example, approximately from four hours to twenty four hours. The drying step may also be carried out under the same conditions as the foregoing drying step; for example, the drying is carried out at the temperature in the range of 100° C. to 200° C., preferably in the range of 120° C. to 140° C., for about twelve hours to thirty six hours.

Furthermore, the resultant raw mixture powder is pre-fired in a pre-firing step. This pre-firing step is carried out at a temperature not higher than a firing temperature, e.g., in the range of 700° C. to 800° C. for a pre-firing duration of about one hour to ten hours. When this pre-firing step 8 is carried out at the temperature in the range of about 700° C. to 800° C., the pre-fired product can contain forsterite in the form of crystals.

Thereafter, a pulverizing step is carried out to pulverize the pre-fired product and then a drying step is carried out to dry the pulverized powder. The pulverizing step is carried out by dry pulverization or by wet pulverization; when the pulverizing step is carried out by wet pulverization, for example, pure water or ethanol is used as a mixing solvent and the pulverization is carried out using a ball mill or the like. A mixing duration may be, for example, approximately from four hours to twenty four hours. The drying step is to perform drying, for example, at the temperature in the range of 100° C. to 200° C., preferably in the range of 120° C. to 140° C., for about twelve hours to thirty six hours. When the pre-firing and pulverization are carried out as described above, the major component and the low-temperature-fired component can be uniformized.

The above process results in obtaining the dielectric-porcelain composition being the main composition. For producing the ceramic substrate according to the first aspect of the present invention, the next process is to add $ZnAl_2O_4$ to the dielectric-porcelain composition as the main composition, further add an organic binder of a polyvinyl alcohol type, acrylic type, or ethyl cellulose type, mix them with a ball mill or the like, and thereafter form the mixture in a desired shape. The forming step may be carried out by wet forming such as a sheet method or a printing method, or by dry forming such as press forming, and a forming method may be optionally selected according to the forming shape or the like. An additive amount of $ZnAl_2O_4$ is up to 25 vol. % (excluding zero) to the main composition. $ZnAl_2O_4$ is added in the foregoing proportion to the main composition, and the mixture is mixed, formed in a desired substrate shape, and fired. The addition of $ZnAl_2O_4$ may be carried out simultaneously with the aforementioned mixing of the raw powder, which also achieves the same effect.

For producing the ceramic substrate according to the second aspect of the present invention, an $Al_2O_3$ powder is added to the dielectric-porcelain composition as the main composition, an organic binder of a polyvinyl alcohol type, acrylic type, or ethyl cellulose type is further added thereto, they are mixed with a ball mill or the like, and thereafter the mixture is formed in a desired shape. The forming step may be carried out by wet forming such as a sheet method or a printing method, or by dry forming such as press forming, and a forming method can be optionally selected according to the forming shape or the like. The average particle size of the $Al_2O_3$ powder to be added is preferably not more than 1.0 μm as described above. An additive amount of the $Al_2O_3$ powder is not more than 7 vol. % (excluding zero) to the main composition. The $Al_2O_3$ powder is added in the aforementioned proportion to the main composition, they are mixed, and thereafter the mixture is formed in a predetermined substrate shape and fired. The addition of the $Al_2O_3$ powder may be carried out simultaneously with the aforementioned mixing of the raw powder, which can also achieve the same effect.

The formed product resulting from the above-described forming is fired in a firing step to obtain a sintered body. The firing is preferably carried out in an atmosphere containing oxygen, e.g., in air. A firing temperature can be optionally set, but the addition of the low-temperature-fired component permits the product to be fired at a low temperature, and thus to be fired at a temperature (e.g., 1000° C. or lower) not more than the melting point of electrodes.

Through the above steps, we can obtain the ceramic substrate having the sufficient bending strength and excellent dielectric property, the relative permittivity $\in r$ of 7±1 and Q·f of not less than 2000 GHz. The resultant ceramic substrate according to the first or second aspect of the present invention has the coefficient of thermal expansion a of not less than 9.0 ppm/° C., the difference of which is small from the coefficient of thermal expansion of the printed circuit board such as a glass epoxy substrate. In the case where the Ag conductor or the like is formed on the surface of the ceramic substrate according to the first aspect of the present invention and simultaneously fired, the region around the conductor is prevented from becoming discolored.

[Second Embodiment]
Dielectric-Porcelain Composition

A preferred embodiment of the dielectric-porcelain composition according to the present invention will be described below in detail as the second embodiment.

The dielectric-porcelain composition of the present embodiment contains $Mg_2SiO_4$ as a major component and also contains as minor components a zinc oxide, a boron oxide, an alkaline earth metal oxide, a copper compound, and a lithium compound.

<Major Component>

$Mg_2SiO_4$ (forsterite) contained as the major component in the dielectric-porcelain composition singly has the Q·f value of not less than 200000 GHz and a low dielectric loss, and therefore it has a function to lower the dielectric loss of the dielectric-porcelain composition. Since $Mg_2SiO_4$ has the relative permittivity $\in r$ as low as about 6 to 7, it also has a function to lower $\in r$ of the dielectric-porcelain composition.

From the viewpoint of decreasing the dielectric loss of the dielectric-porcelain composition, the proportion of $Mg_2SiO_4$ in the major component is preferably 100 vol. %, but a major component except for $Mg_2SiO_4$ can also be used in combination with $Mg_2SiO_4$, in order to adjust the relative permittivity $\in r$. Examples of the major component except for $Mg_2SiO_4$ include magnesium titanate ($MgTiO_3$) having $\in r$ of about 17, and calcium titanate ($CaTiO_3$) having $\in r$ of about 200.

A molar ratio of MgO and $SiO_2$ forming $Mg_2SiO_4$ is stoichiometrically $MgO:SiO_2=2:1$, but the ratio does not always have to be limited to this and may deviate from the stoichiometric ratio within the scope where the effect of the present invention is not damaged. For example, the molar ratio can be $MgO:SiO_2=1.9:1.1$ to $2.1:0.9$.

The content of $Mg_2SiO_4$ in the dielectric-porcelain composition of the present embodiment is preferably the rest after excluding the below-described minor components from the whole of the dielectric-porcelain composition. As the dielectric-porcelain composition contains $Mg_2SiO_4$ of the major component in the above-described condition, the effect of decreasing the dielectric loss and relative permittivity is surely achieved. In the case where the aforementioned component except for $Mg_2SiO_4$ is contained as the major component, the total of the major components may be the rest after excluding the below-described minor components from the whole of the dielectric-porcelain composition.

<Minor Components>

The dielectric-porcelain composition of the present embodiment contains the zinc oxide, boron oxide, alkaline earth metal oxide, copper compound, and lithium compound as minor components relative to the major component of $Mg_2SiO_4$.

When the dielectric-porcelain composition contains the above minor components, the sintering temperature of the dielectric-porcelain composition decreases, whereby the dielectric-porcelain composition can be fired simultaneously with the Ag-based metal at a temperature lower than the melting point of the conductor material consisting of the Ag-based metal and whereby it is feasible to suppress the decrease of bending strength due to the decrease in the firing temperature of the dielectric-porcelain composition.

When the mass of the zinc oxide is converted to ZnO, the content a (unit: mass %) of the zinc oxide being one of the minor components is preferably in the range of $8.0 \leq a \leq 20$ and more preferably in the range of $12.0 \leq a \leq 16.0$, relative to the whole of the dielectric-porcelain composition.

If a is less than 8, the low-temperature sintering effect (effect of enabling sintering of the dielectric-porcelain composition at the lower temperature) tends to become inadequate and the effect of improving the bending strength of the dielectric-porcelain composition (dielectric porcelain) after fired tends to become reduced. On the other hand, if a exceeds 20, the dielectric loss tends to increase and Q tends to decrease, so as to increase the dielectric loss. Therefore, these tendencies can be controlled by setting the content a of the zinc oxide within the aforementioned preferred range. A specific example of the zinc oxide is ZnO.

When the mass of the boron oxide is converted to $B_2O_3$, the content b (unit: mass %) of the boron oxide being one of the minor components is preferably in the range of $3.0 \leq b \leq 10$ and more preferably in the range of $4.0 \leq b \leq 8.0$, relative to the whole of the dielectric-porcelain composition.

If b is less than 3, the low-temperature sintering effect tends to become inadequate and Q tends to decrease so as to increase the dielectric loss. On the other hand, if b exceeds 10, the density of the dielectric-porcelain composition (dielectric porcelain) after fired will be likely to become low and the effect of improving the bending strength tends to become reduced. These tendencies can be controlled by setting the content b of the boron oxide within the aforementioned preferred range. A specific example of the boron oxide is $B_2O_3$.

When the mass of the lithium compound is converted to $Li_2O$, the content c (unit: mass %) of the lithium compound being one of the minor components is preferably in the range of $0.38 \leq c \leq 1.2$ and more preferably in the range of $0.38 \leq c \leq 0.6$, relative to the whole of the dielectric-porcelain composition.

If c is not more than 0.38, the low-temperature sintering effect tends to become inadequate and the effect of improving the bending strength of the dielectric-porcelain composition (dielectric porcelain) after fired tends to become reduced. On the other hand, if c is not less than 1.2, the resultant substrate (dielectric porcelain) after fired tends to crack and thus there is a tendency of failing to obtain a desired substrate. These tendencies can be controlled by setting the content c of the lithium compound within the aforementioned preferred range, whereby the dielectric-porcelain composition can be fired at a lower temperature and whereby it is feasible to more surely suppress the reduction of bending strength due to the decrease in the firing temperature of the dielectric-porcelain composition. Specific examples of the lithium compound include $Li_2O$, $Li_2CO_3$, and so on.

When the mass of the alkaline earth metal oxide is converted to RO (where R designates an alkaline earth metal element), the content d (unit: mass %) of the alkaline earth metal oxide being one of the minor components is preferably in the range of $1.0 \leq d \leq 4.0$ and more preferably in the range of $2.0 \leq d \leq 3.0$, relative to the whole of the dielectric-porcelain composition. When the dielectric-porcelain composition contains the alkaline earth metal oxide, the low-temperature sintering effect of the dielectric-porcelain composition becomes prominent.

If d is less than 1.0, the low-temperature sintering effect tends to become inadequate and the density of the dielectric-porcelain composition (dielectric porcelain) after fired is likely to become lower, causing a tendency of degrading the effect of improving the bending strength. On the other hand, if d exceeds 4.0, the low-temperature sintering effect becomes prominent, but Q decreases, causing a tendency of increasing the dielectric loss. These tendencies can be controlled by setting the content d of the alkaline earth metal oxide within the foregoing preferred range.

The alkaline earth metal R is preferably any one of Ba, Sr, and Ca or may be a mixture of two or more thereof. Specific examples of the alkaline earth metal oxide RO include BaO, SrO, CaO, MgO, and so on.

When the mass of the copper oxide is converted to CuO, the content e (unit: mass %) of the copper oxide being one of the minor components is preferably in the range of $2.0 \leq e \leq 8.0$ and more preferably in the range of $4.0 \leq e \leq 6.0$, relative to the whole of the dielectric-porcelain composition.

If e is less than 2.0, the low-temperature sintering effect tends to become inadequate and the density of the dielectric-porcelain composition (dielectric porcelain) after fired is likely to become lower, causing a tendency of degrading the effect of improving the bending strength. On the other hand, if e exceeds 8.0, Q tends to decrease, so as to increase the dielectric loss. These tendencies can be controlled by setting the content e of the copper oxide within the foregoing preferred range. A specific example of the copper oxide is CuO.

<Process for Producing Dielectric-Porcelain Composition>

The below will describe an example of a process for producing the dielectric-porcelain composition of the present embodiment.

The raw materials of the major component and minor components of the dielectric-porcelain composition can be, for example, $Mg_2SiO_4$, zinc oxide, boron oxide, alkaline earth metal oxide, copper compound, and lithium oxide, or compounds that become these oxides through firing (below-described thermal treatment such as pre-firing). The compounds to become the oxides through firing can be, for example, carbonates, nitrates, oxalates, hydroxides, sulfides, organometallic compounds, and so on.

In production of the dielectric-porcelain composition, for example, magnesium oxide and silicon oxide being the raw materials of $Mg_2SiO_4$ (forsterite) as the major component are weighed by respective predetermined amounts and mixed. The mixing of magnesium oxide and silicon oxide can be carried out by a mixing method such as dry mixing or wet mixing and can be carried out, for example, with a ball mill using a solvent such as pure water or ethanol. A mixing duration may be approximately from four hours to twenty four hours.

The mixture of magnesium oxide and silicon oxide is dried at the temperature preferably in the range of 100 to 200° C., more preferably in the range of 120 to 140° C., for about twelve to thirty six hours, and thereafter pre-fired. This pre-firing results in synthesizing $Mg_2SiO_4$ (forsterite crystals). The pre-firing temperature is preferably in the range of 1100 to 1500° C. and more preferably in the range of 1100 to 1350° C. The pre-firing is preferably carried out for about one hour to twenty four hours.

The synthesized forsterite crystals are pulverized into powder and thereafter dried. This provides the powder of $Mg_2SiO_4$ (forsterite crystals). The pulverization may be carried out by a pulverizing method such as dry pulverization or wet pulverization and can be carried out, for example, with a ball mill using a solvent such as pure water or ethanol. A pulverization duration may be approximately from four to twenty four hours. The drying of the powder may be carried out at the drying temperature preferably in the range of 100 to 200° C., more preferably in the range of 120 to 140° C., for about twelve to thirty six hours.

Since unreacted raw-material components in forsterite need to be made as small as possible in order to enhance the aforementioned effect by $Mg_2SiO_4$ (forsterite crystals), the mixture of magnesium oxide and silicon oxide is preferably prepared by mixing magnesium oxide and silicon oxide so that the number of moles of magnesium is twice as many as the number of moles of silicon.

A commercially available forsterite may be used instead of synthesizing the forsterite crystals from the magnesium-containing raw material and the silicon-containing raw material. Namely, the commercially available forsterite is pulverized by the above-described method, and dried to obtain a powder of forsterite.

Next, the resultant $Mg_2SiO_4$ powder, and the zinc oxide, boron oxide, alkaline earth metal carbonate, copper compound, and lithium oxide being the raw materials of the minor components of the dielectric-porcelain composition are weighed by respective predetermined amounts and thereafter these are mixed to obtain a raw mixture powder. The weighing of the raw materials of the respective minor components is carried out so that the content of each minor component becomes the aforementioned desired proportion (mass %) to the whole of the dielectric-porcelain composition, in the completed dielectric-porcelain composition. The mixing can be performed by a mixing method such as dry mixing or wet mixing and can be carried out, for example, with a ball mill using a solvent such as pure water or ethanol. A mixing duration may be approximately from four hours to twenty four hours.

The raw mixture powder is dried at the drying temperature preferably in the range of 100 to 200° C., more preferably in the range of 120 to 140° C., for about twelve to thirty six hours.

Then the raw mixture powder is pre-fired at the temperature not more than the firing temperature (860 to 1000° C.) in a below-described firing step, e.g. at 700 to 800° C., for about one hour to ten hours. When the pre-firing is carried out at the temperature not more than the firing temperature in this manner, forsterite in the raw mixture powder is prevented from melting, so that the completed dielectric-porcelain composition can contain forsterite in the crystal form.

The raw mixture powder after pre-fired is pulverized and the raw mixture powder is then dried to obtain the dielectric-porcelain composition of the present embodiment. The pulverization can be carried out by a pulverization method such as dry pulverization or wet pulverization and can be carried out, for example, with a ball mill using a solvent such as pure water or ethanol. A pulverization duration may be approximately from four hours to twenty four hours. The drying of the raw mixture powder after pulverization may be carried out at the treatment temperature preferably in the range of 100 to 200° C., more preferably in the range of 120 to 140° C., for about twelve to thirty six hours.

Since the pre-firing and pulverization are carried out totally twice at the point before the mixing of the raw materials and at the point after the mixing of the raw materials to obtain the raw mixture powder as described above, the major component and minor components of the dielectric-porcelain composition are homogeneously mixed to obtain the dielectric-porcelain composition with uniform quality of material.

The dielectric-porcelain composition obtained in this manner is sintered, for example, by a firing step to fire it at 860-1000° C., whereby it turns into a dielectric porcelain having a low dielectric loss and low relative permittivity and also having a sufficient bending strength. Therefore, such a dielectric-porcelain composition is suitably applicable to a raw material of a dielectric porcelain which constitutes a part of an electronic component such as a filter, a resonator, a capacitor, or a circuit board.

The above described the preferred embodiment of the dielectric-porcelain composition according to the present invention, but it should be noted that the present invention is by no means limited to the above-described embodiment.

For example, the dielectric-porcelain composition according to the present invention may contain another compound to the extent that it is feasible to perform the firing at the low temperature and it does not hinder the effect of suppressing the degradation of bending strength due to the decrease of firing temperature. For example, the dielectric-porcelain composition may further contain a manganese oxide as a minor component to the major component thereof, whereby the dielectric loss can be more reduced.

EXAMPLES

The following will describe specific examples to which the present invention is applied, based on experiment results, but the present invention is by no means intended to be limited to these examples.

[Samples No. 1 to No. 17]

<Examination of Main Composition>

Raw material powders prepared were high-purity $Mg_2SiO_4$, ZnO, $B_2O_3$, CuO, $CaCO_3$, $SrCO_3$, and $BaCO_3$. The average particle size of each raw material powder was from 0.1 μm to 1.0 μm. The raw material powders were weighed so that the additive amounts of the minor components (ZnO, $B_2O_3$, CuO, CaO, SrO, and BaO) to $Mg_2SiO_4$ were in the blending proportions shown in Table 1, and they were mixed for sixteen hours by wet mixing using a ball mill. Each resultant slurry was fully dried and then pre-fired as kept at 700° C. in air for two hours, to obtain a pre-fired product. The pre-fired product was finely pulverized with a ball mill until the average particle size became 1.0 μm. Thereafter, the finely pulverized powder was dried. Then an appropriate amount of PVA (polyvinyl alcohol) was added as a binder in the powder and the powder was granulated, formed, and thereafter fired at 950° C. or at 975° C. (or at 1300° C. or at 1350° C. for samples No. 1 and No. 2) for four hours to obtain a sintered body.

With each of the sintered bodies (samples No. 1 to No 17) thus obtained, the bending strength, relative permittivity ∈r, Q, and coefficient of thermal expansion a were measured. The bending strength was measured in accordance with Japanese Industrial Standards JIS R1601. The results are provided in Table 1.

For example, in the case of sample No. 1 and sample No. 2 made of $Mg_2SiO_4$ only, the coefficient of thermal expansion a was large, whereas the sintering at low temperature was hard, and the firing became possible by raising the firing temperature to 1300° C. or 1350° C. In these cases, however, the bending strength was extremely low.

In contrast to it, in the case of samples No. 3 to No. 17 obtained by addition of the low-temperature-fired component, it was feasible to perform the firing even at the low temperature of 950° C. or 975° C. and to achieve a certain level of bending strength. However, sample No. 15 with an asterisk failed to satisfy the requirements for the bending strength, relative permittivity ∈r, and Q value.

From the results in Table 1, sample No. 7 was used as the main composition, $ZnAl_2O_4$ was added to the finely pulverized powder of the main composition, the mixture was granulated and formed, and thereafter the resultant was fired at 960° C. or 950° C. for four hours, thereby preparing ceramic substrates. Table 2 provides the bending strength, relative permittivity ∈r, Q, and coefficient of thermal expansion a of each of the ceramic substrates obtained (Example 1 to Example 4).

TABLE 2

|  | ZnO | $B_2O_3$ | CuO | CaO | $ZnAl_2O_4$ | σ [MPa] | FIRING TEMPERATURE[° C.] | ∈ | Q | α |
|---|---|---|---|---|---|---|---|---|---|---|
| EXAMPLE 1 | 16 | 6 | 4 | 2 | 5 vo % | 320 | 940 | 7.3 | 1500 | 10.0 |
| EXAMPLE 2 | 16 | 6 | 4 | 2 | 10 vol % | 345 | 940 | 7.31 | 1803 | 10.0 |
| EXAMPLE 3 | 16 | 6 | 4 | 2 | 20 vol % | 335 | 980 | 7.0 | 1900 | 10.2 |
| EXAMPLE 4 | 16 | 6 | 4 | 2 | 25 vol % | 325 | 990 | 6.8 | 2300 | 10.0 |

As apparent from Table 2, the addition of $ZnAl_2O_4$ leads to significant improvement in bending strength. Every example showed the coefficient of thermal expansion a of not less than 9.0 ppm/° C. and good values of the relative permittivity ∈r and Q.

With change in the additive amount of $ZnAl_2O_4$ in the range of 5 vol. % to 30 vol. %, a relation of firing temperature vs. bending strength was investigated at each additive amount. The main composition was the same as sample No. 7. The results are provided in FIG. 1. When the additive amount of $ZnAl_2O_4$ was 30 vol. %, the bending strength decreased at the firing temperature of 940° C.

Next, from the results in Table 1, sample No. 7 was used as the main composition, an $Al_2O_3$ powder was added to the finely pulverized powder of the main composition, the mixture was granulated and formed, and thereafter the resultant was fired at 960° C. or 950° C. for four hours, thereby preparing ceramic substrates. Table 3 provides the bending strength, relative permittivity ∈r, Q, and coefficient of thermal expansion α of each of the ceramic substrates obtained (Example 5 to Example 7).

TABLE 1

| SAMPLE NO. | ZnO | $B_2O_3$ | CuO | CaO | SrO | BaO | σ [MPa] | FIRING TEMPERATURE[° C.] | ∈ | Q | α |
|---|---|---|---|---|---|---|---|---|---|---|---|
| 1 | 0 | 0 | 0 | 0 |  |  | 139 | 1300 | 6.592 | 7975 | 9.5~10.0 |
| 2 | 0 | 0 | 0 | 0 |  |  | 136 | 1350 | 6.522 | 9845 | 9.5~10.0 |
| 3 | 20 | 6 | 4 | 2 |  |  | 320 | 950 | 6.8 | 1200 | 10.0 |
| 4 | 16 | 10 | 4 | 2 |  |  | 290.6 | 950 | 6.992 | 2216 | 10.1 |
| 5 | 16 | 8 | 4 | 2 |  |  | 300.2 | 950 | 7.205 | 1528 | 10.3 |
| 6 | 16 | 6 | 4 | 2 |  |  | 310 | 975 | 7.09 | 1410 | 10.0 |
| 7 | 12 | 9 | 6 | 2 |  |  | 271.4 | 950 | 7.073 | 2269 | 10.2 |
| 8 | 12 | 9 | 8 | 2 |  |  | 311.1 | 950 | 7.135 | 1337 | 10.1 |
| 9 | 12 | 9 | 4 | 2 |  |  | 288.6 | 950 | 6.817 | 2977 | 10.3 |
| 10 | 12 | 9 | 4 | 3 |  |  | 311.1 | 950 | 7.108 | 1743 | 10.3 |
| 11 | 12 | 9 | 2 | 2 |  |  | 290 | 950 | 6.8 | 4000 | 10.3 |
| 12 | 12 | 6 | 4 | 2 |  |  | 311 | 975 | 6.86 | 1508 | 10.3 |
| 13 | 12 | 3 | 4 | 2 |  |  | 319.7 | 950 | 6.894 | 1112 | 10.3 |
| 14 | 8 | 6 | 4 | 2 |  |  | 266.6 | 950 | 6 | 1125 | 10.4 |
| *15 | 4 | 6 | 4 | 2 |  |  | 171.4 | 950 | 3.643 | 1097 | 11.2 |
| 16 | 12 | 9 | 4 |  | 1 |  | 240 | 950 | 6.99 | 3809 | 10.1 |
| 17 | 12 | 9 | 4 |  |  | 1 | 270 | 950 | 6.89 | 3512 | 10.1 |

TABLE 3

| | ZnO | B$_2$O$_3$ | CuO | CaO | Al$_2$O$_3$ | σ [MPa] | FIRING TEMPERATURE [° C.] | ε | Q | α |
|---|---|---|---|---|---|---|---|---|---|---|
| EXAMPLE 5 | 16 | 6 | 4 | 2 | 1.2 (1 vol %) | 358 | 970 | 7.28 | 1905 | 10.8 |
| EXAMPLE 6 | 16 | 6 | 4 | 2 | 6 (5 vol %) | 367 | 990 | 6.8 | 2792 | 10.0 |
| EXAMPLE 7 | 16 | 6 | 4 | 2 | 8.5 (7 vol %) | 340 | 950 | 6.75 | 2605 | 9.9 |

As apparent from Table 3, the addition of the Al$_2$O$_3$ powder leads to significant improvement in bending strength. Every example showed the coefficient of thermal expansion α of not less than 9.0 ppm/° C. and good values of the relative permittivity ∈r and Q.

Figure 2:
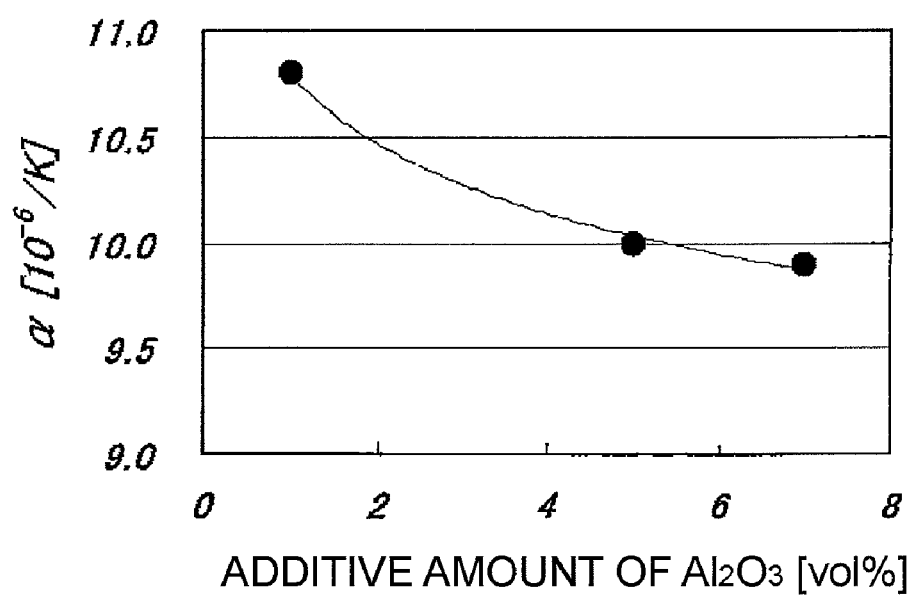
FIG. 2 is a characteristic diagram showing a relation of additive amount of $Al_2O_3$ powder vs. coefficient of thermal expansion a of ceramic substrates produced.

FIG. 2 shows a relation of the additive amount of the Al$_2$O$_3$ powder vs. the coefficient of thermal expansion a of the prepared ceramic substrates. The coefficient of thermal expansion a tends to decrease with increase in the additive amount of the Al$_2$O$_3$ powder. For this reason, it can be said that the additive amount of the Al$_2$O$_3$ powder is preferably not more than 7 vol. % relative to the main composition.

<Examination of Additive Amount of Al$_2$O$_3$ Powder>

Figure 3:
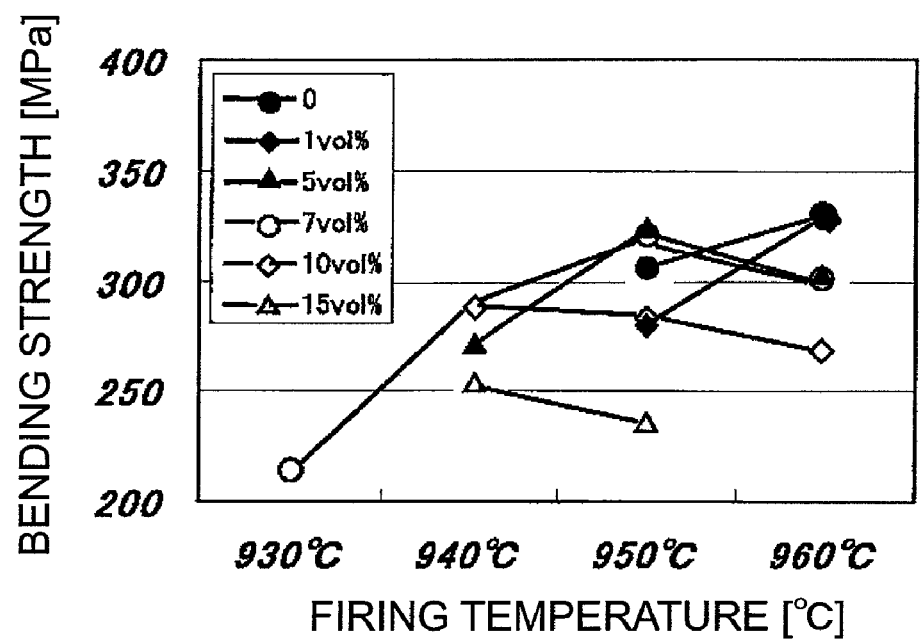
FIG. 3 is a characteristic diagram showing a relation of firing temperature vs. bending strength at each of additive amounts in the additive amount range of $Al_2O_3$ powder from 0 vol. % to 15 vol. %.

With change in the additive amount of the Al$_2$O$_3$ powder in the range of 0 vol. % to 15 vol. %, a relation of firing temperature vs. bending strength was investigated at each additive amount. The main composition was the same as sample No. 7. The results are provided in FIG. 3. When the additive amount of the Al$_2$O$_3$ powder is 0 vol. % or 1 vol. %, the maximum bending strength appears at the high firing temperature of not less than 960° C. In contrast to it, when the additive amount of the Al$_2$O$_3$ powder was 5 vol. % or 7 vol. %, the bending strength became maximum at 950° C. When the firing temperature is 950° C., the simultaneous firing with the conductor is possible. On the other hand, when the additive amount of the Al$_2$O$_3$ powder was not less than 10 vol. %, the bending strength was low at any firing temperature.

<Examination of Average Particle Size of Al$_2$O$_3$ Powder>

Ceramic substrates were prepared using the Al$_2$O$_3$ powder having the average particle size in the range of 1.0 μm to 5.0 μm, and a relation of the average particle size of the Al$_2$O$_3$ powder vs. the bending strength of the ceramic substrates obtained was investigated. The average particle sizes of the Al$_2$O$_3$ powder used were the following four types: average particle size 5.0 pm, average particle size 3.0 μm, average particle size 2.0 μm, and average particle size 1.0 μm. The main composition was the same as sample No. 7 and the additive amount of the Al$_2$O$_3$ powder was 5 vol. %. The firing temperature was 990° C. The results are provided in FIG. 4.

Figure 4:
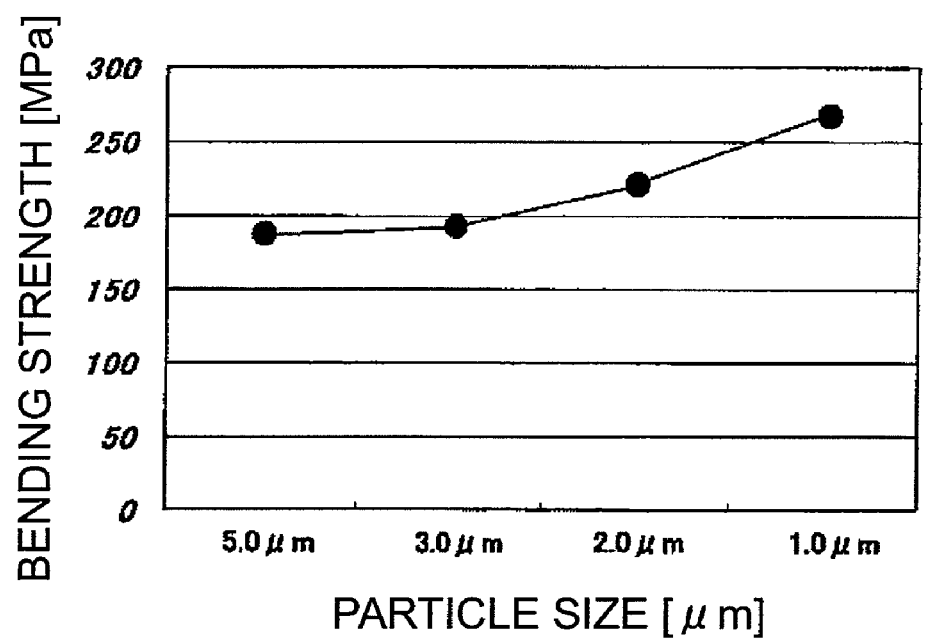
FIG. 4 is a characteristic diagram showing a relation of average particle size of $Al_2O_3$ powder vs. bending strength of ceramic substrates.

As apparent from FIG. 4, the values of bending strength increase with decrease in the average particle size of the Al$_2$O$_3$ powder used. Particularly, when the average particle size of the Al$_2$O$_3$ powder was 1.0 μm, the substrate was obtained with a larger bending strength.

[Sample No. 21]

Sample No. 21 was prepared according to the procedure described below, as a dielectric-porcelain composition which contained Mg$_2$SiO$_4$ as a major component and contained the zinc oxide, boron oxide, alkaline earth metal oxide, copper compound, and lithium compound as minor components, and in which the content of ZnO was 16 mass %, the content of B$_2$O$_3$ 6.0 mass %, the content of CaO 2.0 mass %, the content of CuO 4.0 mass %, and the content of Li$_2$O 0.38 mass %, relative to the whole of the dielectric-porcelain composition.

First, MgO and SiO$_2$ as raw materials of the major component were weighed so that the number of moles of magnesium was twice as many as the number of moles of silicon. Pure water was added to the weighed raw materials to prepare a slurry whose slurry concentration was 25 mass %. This slurry was wet mixed for sixteen hours with a ball mill, and then the mixture was dried at 120° C. for twenty four hours to obtain a powder. This powder was pre-fired at 1200° C. in air for three hours to obtain forsterite crystals (Mg$_2$SiO$_4$). Pure water was added to the forsterite crystals to prepare a slurry whose slurry concentration was 25%. This slurry was pulverized for sixteen hours with a ball mill and then dried at 120° C. for twenty four hours to produce a powder of forsterite crystals being the major component of the dielectric-porcelain composition.

Next, the resultant forsterite crystal powder was blended with each of ZnO, B$_2$O$_3$, CaCO$_3$, CuO, and Li$_2$O being raw materials of the minor components of the dielectric-porcelain composition, and then pure water was further added thereto to produce a slurry whose slurry concentration was 25 mass %. This slurry was wet mixed for sixteen hours with a ball mill and then dried at 120° C. for twenty four hours to obtain a raw mixture powder. The resultant raw mixture powder was pre-fired at 750° C. in air for two hours to obtain a pre-fired powder. Pure water was added to the pre-fired powder to prepare a slurry whose slurry concentration was 25 mass %. This slurry was wet pulverized for sixteen hours with a ball mill and then dried at 120° C. for twenty four hours to obtain a powder of the dielectric-porcelain composition of sample No. 21. The blending amounts of ZnO, B$_2$O$_3$, CaCO$_3$, CuO, and Li$_2$O to the forsterite crystal powder were adjusted so that the completed dielectric-porcelain composition contained 16 mass % ZnO, 6.0 mass % B$_2$O$_3$, 2.0 mass % CaO, 4.0 mass % CuO, and 0.38 mass % Li$_2$O, relative to the whole of the dielectric-porcelain composition.

An organic binder was mixed in the powder of the dielectric-porcelain composition of sample No. 21 and then the resultant was subjected to sheet forming by a doctor blade method, thereby preparing a plurality of sheets. Then a laminate obtained by lamination of the plurality of sheets was pressed to form a substrate, and it was fired at the firing temperature of 940° C. for four hours to obtain a substrate (dielectric porcelain) of sample No. 21.

<Measurement of Bending Strength>

Under the conditions of JIS R1601 (1995), the substrate of sample No. 21 was cut and the bending strength σ (unit: MPa) of sample No. 21 was measured. The measurement result is presented in Table 4.

<Measurement of Density>

The density ρ (unit: g/cm$^3$) of the substrate of sample No. 21 was measured by the Archimedean method. The measurement result is presented in Table 4.

[Samples No. 22 to No. 36]

Figure 5:
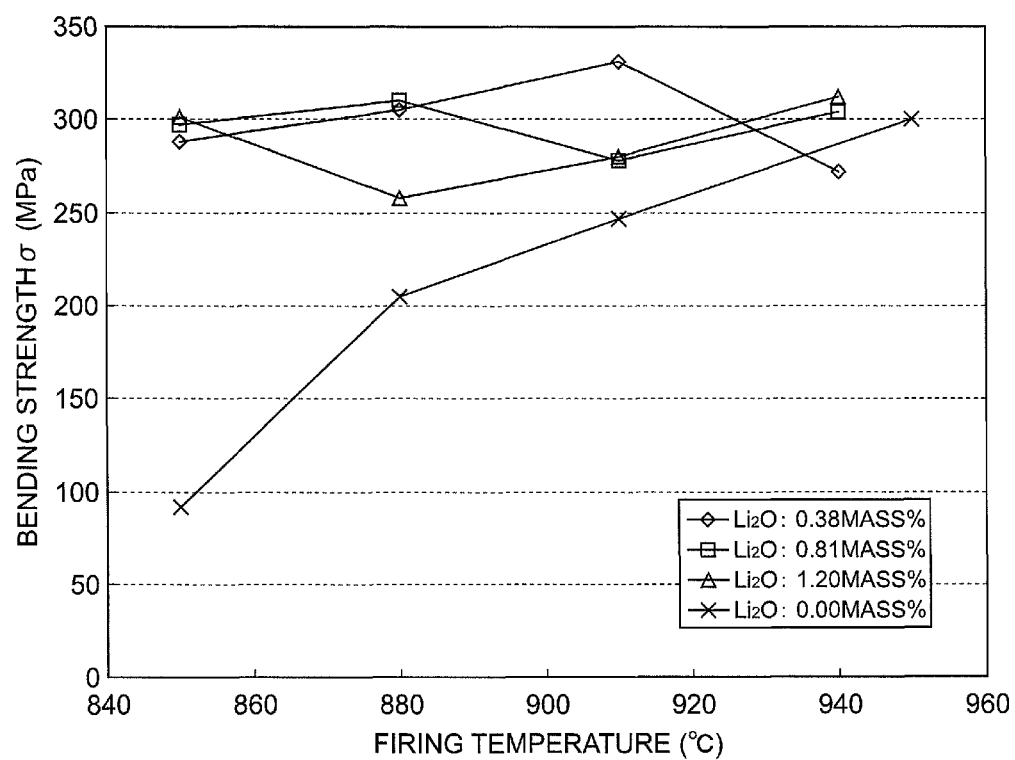
FIG. 5 is a graph in which bending strengths are plotted against firing temperatures of samples No. 21 to No. 36.

The dielectric-porcelain compositions of respective samples No. 22 to No. 36 were prepared by the same method as sample No. 21 was, except that the content (mass %) of Li$_2$O relative to the whole of the dielectric-porcelain composition was changed to the values shown in Table 4. Substrates of respective samples No. 22 to No. 36 were made by the same method as sample No. 21 was, except that laminates formed from the resultant dielectric-porcelain compositions were pressed into the substrates and they were fired at the firing temperatures shown in Table 4. The bending strength and density of each of samples No. 22 to No. 36 were measured by the same methods as those of sample No. 21. The results are provided in Table 4. FIG. 5 shows a graph in which the bending strengths are plotted against the firing temperatures of samples No. 21 to No. 36.

TABLE 4

| SAMPLE NO. | CONTENT c OF $Li_2O$ (MASS %) | FIRING TEMPERATURE [° C.] | BENDING STRENGTH $\sigma$ (MPa) | DENSITY $\rho$ (g/cm³) |
|---|---|---|---|---|
| 21 | 0.38 | 940 | 272 | 3.37 |
| 22 |  | 910 | 331 | 3.37 |
| 22 |  | 880 | 305 | 3.33 |
| 24 |  | 850 | 288 | 3.28 |
| 25 | 0.81 | 940 | 304 | 3.38 |
| 26 |  | 910 | 278 | 3.37 |
| 27 |  | 880 | 310 | 3.38 |
| 28 |  | 850 | 297 | 3.32 |
| 29 | 1.20 | 940 | 312 | 3.33 |
| 30 |  | 910 | 280 | 3.33 |
| 31 |  | 880 | 258 | 3.35 |
| 32 |  | 850 | 301 | 3.32 |
| 33 | 0.00 | 950 | 300 | 3.32 |
| 34 |  | 910 | 247 | 3.23 |
| 35 |  | 880 | 205 | 2.93 |
| 36 |  | 850 | 92 | 2.44 |

It was confirmed, as seen from the comparison of the measurement results of samples No. 21-24, 25-28, 29-32 shown in Table 4 and FIG. 5, that the reduction of the bending strength and the density due to the decrease in firing temperature was well suppressed in the substrates obtained by firing the dielectric-porcelain compositions containing $Mg_2SiO_4$ as the major component and also containing the zinc oxide, boron oxide, alkaline earth metal oxide, copper compound, and lithium compound as the minor components.

On the other hand, as seen from the comparison of the measurement results of samples No. 33 to No. 36, it was confirmed that the bending density and density decreased with decrease in firing temperature, in the substrates obtained by firing the dielectric-porcelain compositions not containing the lithium compound as the minor component.

Industrial Applicability

The present invention is suitably applicable to a circuit board of mobile communication equipment and others using the high-frequency band, e.g., cell phones.

The invention claimed is:

1. A ceramic substrate having a main composition comprising $Mg_2SiO_4$ and a low-temperature-fired component and having a coefficient of thermal expansion $\alpha$ of not less than 9.0 ppm/° C.,
  said ceramic substrate comprising up to 25 vol. % (excluding zero) $ZnAl_2O_4$,
  wherein the main composition comprises $Mg_2SiO_4$ as a major component and the low-temperature-fired component comprises ZnO, $B_2O_3$, CuO, and RO (where R designates an alkaline earth metal), and
  wherein, where a is a mass of said $Mg_2SiO_4$, b a mass of ZnO, c a mass of $B_2O_3$, d a mass of CuO, and e a mass of RO, relative to a total mass (a+b+c+d+e), a proportion of the mass b of ZnO, b/(a+b+c+d+e), is in the range of 8% to 20%, a proportion of the mass c of $B_2O_3$, c/(a+b+c+d+e), is in the range of 3% to 10%, a proportion of the mass d of CuO, d/(a+b+c+d+e), is in the range of 2% to 8%, and a proportion of the mass e of RO, e/(a+b+c+d+e), is in the range of 1% to 4%.

2. The ceramic substrate according to claim 1, wherein a content of $ZnAl_2O_4$ is in the range of 5 vol. % to 20 vol. %.

* * * * *